(12) United States Patent
Jacob

(10) Patent No.: US 7,091,782 B2
(45) Date of Patent: Aug. 15, 2006

(54) RADIO APPARATUS COMPRISING AN AMPLIFIER FOR RADIO-FREQUENCY SIGNALS, AMPLIFIER FOR RADIO-FREQUENCY SIGNALS AND METHOD FOR AMPLIFYING SUCH SIGNALS

(75) Inventor: Hervé Jacob, Saint-Contest (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 88 days.

(21) Appl. No.: 10/512,623

(22) PCT Filed: Apr. 22, 2003

(86) PCT No.: PCT/IB03/01570

§ 371 (c)(1),
(2), (4) Date: Oct. 26, 2004

(87) PCT Pub. No.: WO03/094342

PCT Pub. Date: Nov. 13, 2003

(65) Prior Publication Data

US 2005/0162226 A1 Jul. 28, 2005

(30) Foreign Application Priority Data

Apr. 30, 2002 (FR) .................... 02 05440

(51) Int. Cl.
*H03F 1/00* (2006.01)
(52) U.S. Cl. .................... 330/151; 330/149
(58) Field of Classification Search ............... 330/151, 330/149
See application file for complete search history.

(56) References Cited

U.S. PATENT DOCUMENTS 5,077,532 A * 12/1991 Obermann et al. .......... 330/151
6,011,434 A * 1/2000 Sakai ....................... 330/151
6,275,105 B1 * 8/2001 Ghannouchi et al. ....... 330/151
6,640,110 B1 * 10/2003 Shapira et al. ........... 455/562.1

FOREIGN PATENT DOCUMENTS

WO WO0150594 7/2001

\* cited by examiner

*Primary Examiner*—Patricia Nguyen

(57) ABSTRACT

This apparatus comprises a high-frequency signal amplifier formed by a main power stage (30) which has an input for an incoming signal, an output for the amplified signal and a gain control (37). This amplifier also comprises a first comparator (49) for producing a signal that has a distortion level between the incoming signal and the amplified signal, and a differential element (45) for removing the distortion signal from the amplified signal. Moreover, for the distortion signal to be of the same level as the distortions caused by the main power stage, a secondary amplifier stage (53) is added which is inserted in a canceling loop so that the power of its output signal is constant. This loop is constituted by a measuring circuit for measuring the output power of said auxiliary amplifier stage by a comparing circuit for comparing this power to a reference value (61) and by a processing circuit (58) for influencing said gain control (37). Application: Amplifier for mobile radio telephones.

10 Claims, 3 Drawing Sheets

RADIO APPARATUS COMPRISING AN AMPLIFIER FOR RADIO-FREQUENCY SIGNALS, AMPLIFIER FOR RADIO-FREQUENCY SIGNALS AND METHOD FOR AMPLIFYING SUCH SIGNALS

The invention relates to an apparatus comprising a high-frequency signal amplifier formed by a main power stage which has an incoming signal input, an output for an amplified signal and a gain control, also comprising a first comparator for producing a signal that has a distortion level between the incoming signal and the amplified signal and a differential element for removing the distortion signal from the amplified signal.

The invention also relates to a method for amplifying such signals as well as such an amplifier.

The invention finds important applications notably as regards mobile radio telephony.

Such an apparatus is known from patent document EP WO 01/50594. This document relates to the amplifier linearization produced according to LDMOS technology. A bias point of the amplifier is assumed that minimizes the distortion provided by the latter.

The present invention proposes an apparatus of the type mentioned in the opening paragraph which can be applied to another technology than LDMOS, based on another approach.

For this purpose such an apparatus is characterized in that the differential element co-operates with an auxiliary amplifier stage which is inserted into a canceling loop for producing a constant-power distortion canceling signal.

These and other aspects of the invention are apparent from and will be elucidated, by way of non-limitative example, with reference to the embodiment(s) described hereinafter.

Figure 1:
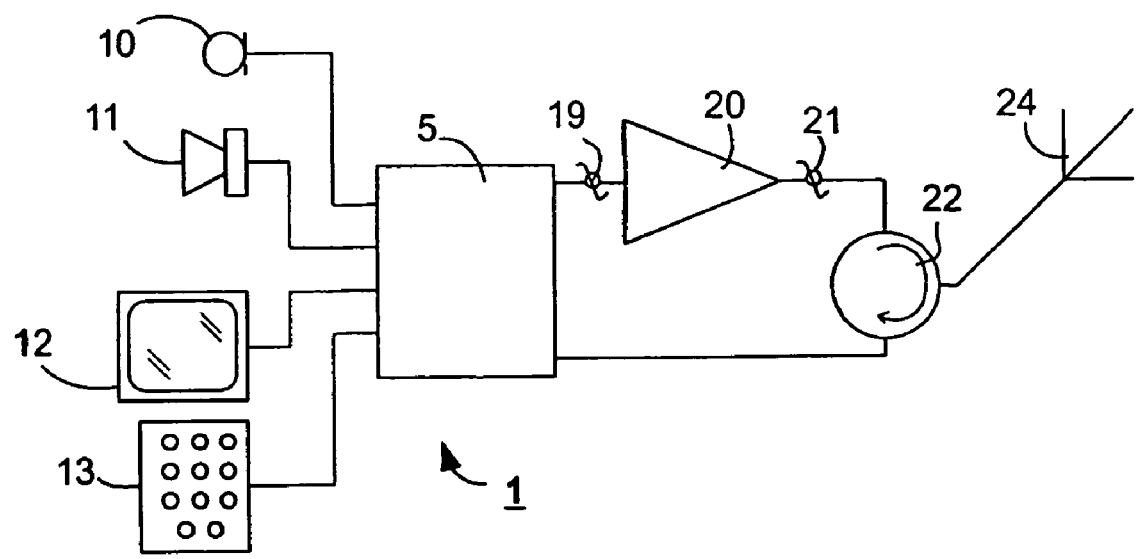
FIG. 1 shows an apparatus according to the invention.

In FIG. 1 the apparatus is referred to as 1. This apparatus in the framework of the example described is a mobile radio telephone for cellular networks. It comprises an electronic assembly 5 to which are connected, on the one hand, man-machine devices and, on the other hand, a radio part. These man-machine devices are a microphone 10, a loudspeaker 11, a screen 12 and a keyboard 13. The radio part is formed by a high-frequency amplifier 20 which has an input 19 and an output 21. This amplifier supplies waves via a wave decoupler (duplexer) 22 to an antenna 24. The signals received by this antenna come back to the assembly 5 via this decoupler 22.

Figure 2:
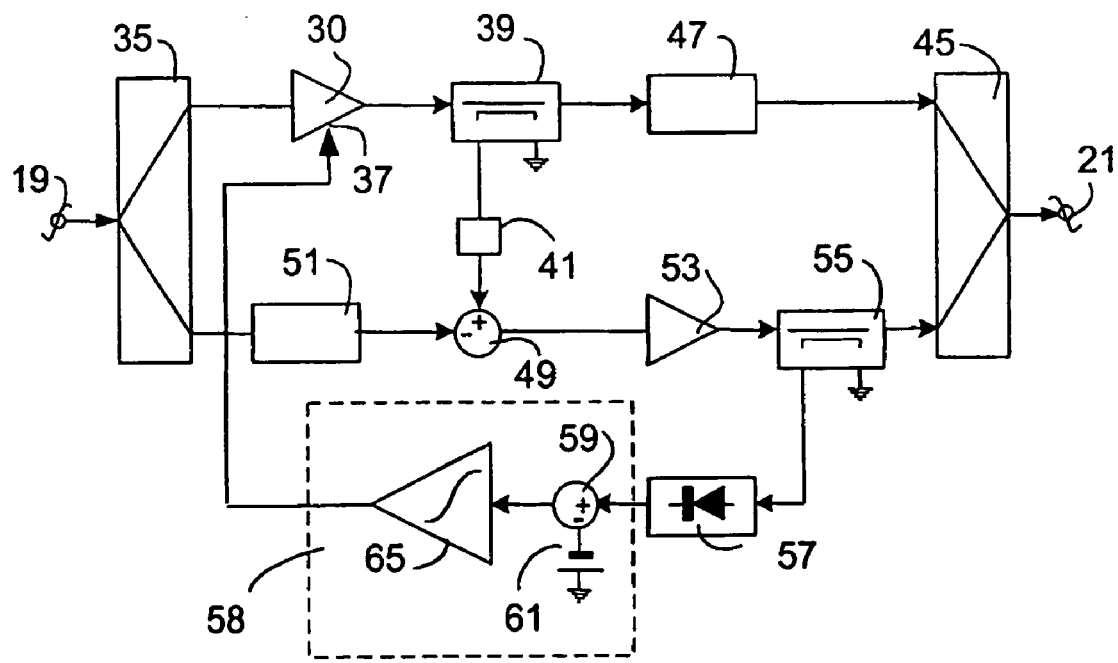
FIG. 2 shows a first embodiment of the invention.

FIG. 2 shows in detail the amplifier 20 according to the invention. It is constituted by a main power stage 30 whose input is connected to the input terminal 19 via a power distributor 35. This amplifier 30 has a gain control input 37. This gain control varies the biasing of the transistors this stage is provided with. Its output is connected to a power coupler 39 which takes part of this power to an attenuator 41. The power produced by this amplifier 30 is transmitted to a power combiner 45 via a delay element 47. A subtraction element 49 determines the distortion caused by the amplifier 30 by comparing the voltage of the signal tapped by the coupler 39 with that of the signal applied to the input 19. This is possible by adjusting the value of the levels; for this purpose is regulated once and for all the attenuation caused by the attenuator 41 and a delay caused by a delay element 51 is added thereto so as to compensate for the delay caused by the amplifier 30. Thus, by admitting that the delay element 51 and the attenuator 41 do not cause any distortion, the signal on the output of the subtraction element represents solely the parasitic signals caused by the distortion of this amplifier stage 30. The output signal is amplified by an amplifier stage 53 and is finally applied to the power combiner 45 via a coupler 55, so that the distortion is largely suppressed at the output 21.

According to the invention the power of the distortion level measured at the output of the amplifier 53 is locked on to a constant level. For this purpose, part of the power of this amplifier is tapped by the coupler 55. This tapped power is measured by means of a level measuring circuit 57. The signal produced by this measuring circuit 57 is processed by a processing circuit 58 which mainly has the function of integrator/comparator. This circuit 58 comprises a comparator 59 for comparing the signal produced by the measuring circuit 57 with a reference magnitude that is represented by a voltage generator 61. The output signal of the comparator 59 is applied to an amplifier 65 which preferably shows a hysteresis. The output signal of this amplifier which forms the output of the circuit 58 is finally applied to the gain control input of the amplifier 30. In this way a control loop of the power of the auxiliary amplifier 53 is constituted by influencing the gain of the main amplifier 30.

Figure 3:
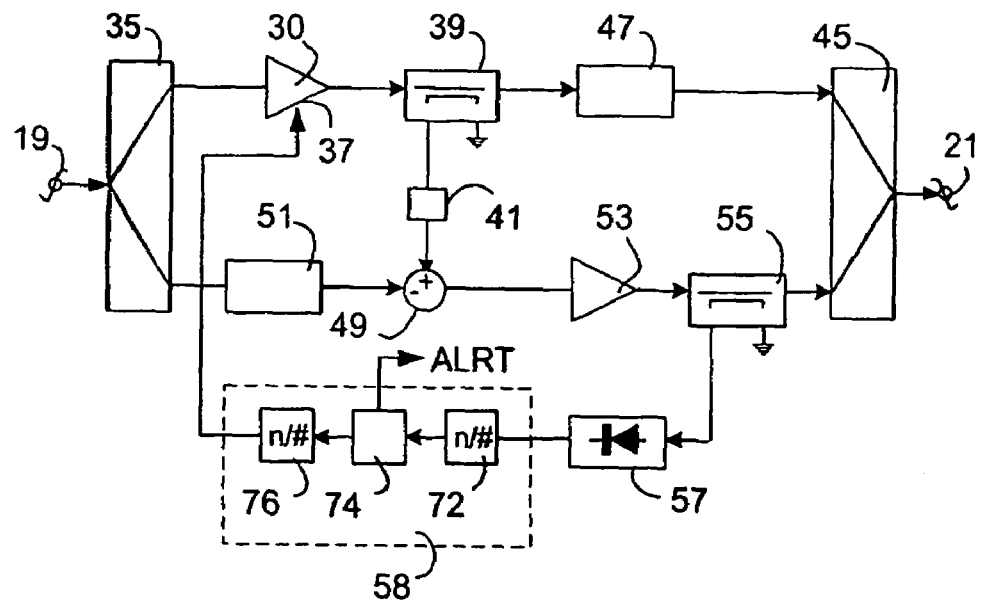
FIG. 3 shows a second embodiment of the invention.

In FIG. 3 another embodiment variant of the amplifier according to the invention is shown. This variant more particularly relates to the integrating/comparing circuit 58. In this FIG. 3 the elements that are shared with those of the preceding Figures have the same reference characters. In this variant the input of the circuit 58 is formed by the input of an analog-to-digital converter 72, followed by a digital processing circuit 74 producing inter alia the desired hysteresis effect. This digital processing circuit is followed in its turn by a digital-to-analog converter 76 to finally produce the control signal at the control input of the amplifier 30. The presence of this digital processing circuit provides great flexibility for the amplifier to be adapted to various configurations. For example, the gain control of the amplifier 37, which is in fact a bias control step of this amplifier, may be adjusted to avoid any instability. It is also possible to produce an alarm signal ALRT when the power level on the output of the amplifier 53 is maximum, whereas it is impossible to influence the control 37 which is stopped as these parameters are incorporated in this circuit 74.

The invention is based on the following considerations. Within the framework of the application at hand, that is to say the one relating to radio transmissions satisfying the UMTS-FDD requirements edited by the ETSI, the final amplifiers supplying the radio power are to maintain good performance over a large power range. For example, according to the requirements mentioned:

Class 4: power running from −44 dBm to +24 dBm, that is a 68 dB dynamic

Class 3: power running from −44 dBm to +21 dBm, that is a 65 dB dynamic

If the measures according to the invention are not taken, there will be difficulty in working at a low level with a good power efficiency. When influencing the bias of the amplifier 30 to reduce its consumption based on an a priori estimate, this amplifier would run the risk of remaining out of service too much or to be biased at an insufficient level. The auxiliary amplifier 53 would rapidly reach saturation because of its small dimensions and it would thus be insufficient to provide the whole amplification and/or to realize the compensation for distortion when there is immediate need for more power. As a result of the measure according to the invention the amplifiers 30 and 53 work at a non-zero power but which is sufficiently low to produce substantial saving of energy.

Figure 4:
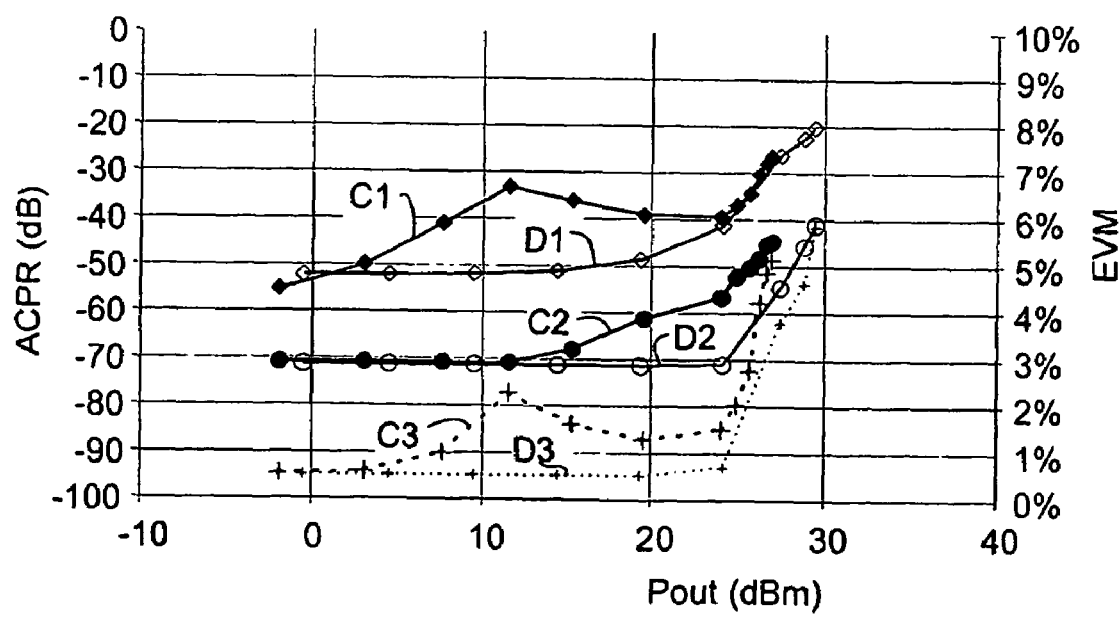
FIG. 4 shows curves explaining the advantages provided by the invention.

FIG. 4 shows curves intended to illustrate the importance of the invention. The curves demonstrate that thanks to the measures according to the invention sufficient performance is obtained for satisfying the requirements of the UMTS-FDD standard. The curves C1, C2 and C3 in solid lines show the characteristics of the amplifier 20 obtained in conformity with the invention as a function of the output power Pout. These curves give the value of the parameter ACPR for the curves C1 and C2 and the value EVM for the curve C3. The parameter ACPR relates to adjacent power ratio, whereas the parameter EVM relates to the error vector. In the standard mentioned above the meaning of the parameters EVM and ACPR will be found. The curve C1 relating to adjacent channels rises from the power level of 0 dBm when the auxiliary amplifier starts to cancel the distortion, then this parameter remains constant in the range from +12 dBm/+26 dBm, which corresponds to the effect brought about by the control loop for keeping the output power of the amplifier 53 constant. Then one witnesses a rise of this curve C1 (−33 dB) due to the limitation of the bias and thus of the available power of the amplifier 30. It is thus no longer possible for the auxiliary amplifier 53 to compensate for the distortions. This cannot be compared to the curve D1 which relates to the prior-art amplifier. This curve stays at a low level up to the value Pout=+20 dBm and then rapidly grows when the amplifier becomes non-linear without any compensation for distortion. Finally, the level (−33 dB ACPR) is comparable with that of the curve C1 for an output power of +26/+26.5 dBm.

The curves C2 and D2 relating to implementing and not implementing the application respectively relate to the alternate channels (N−2) and (N+2). The results are then comparable and are not considered questionable.

The curves C3 and D3 taking the vector error EVM into account show a similar behavior to curves C2 and D2. The UMTS standard indicates 17% EVM for the transmitter, taking clock jitter phenomena into account, of the non-linearity of the various digital-to-analog converters which the apparatus comprises. This necessitates that the amplifier is to make a several percent lower contribution to this distortion. If one makes 3% a rule, the two solutions are identical.

Figure 5:
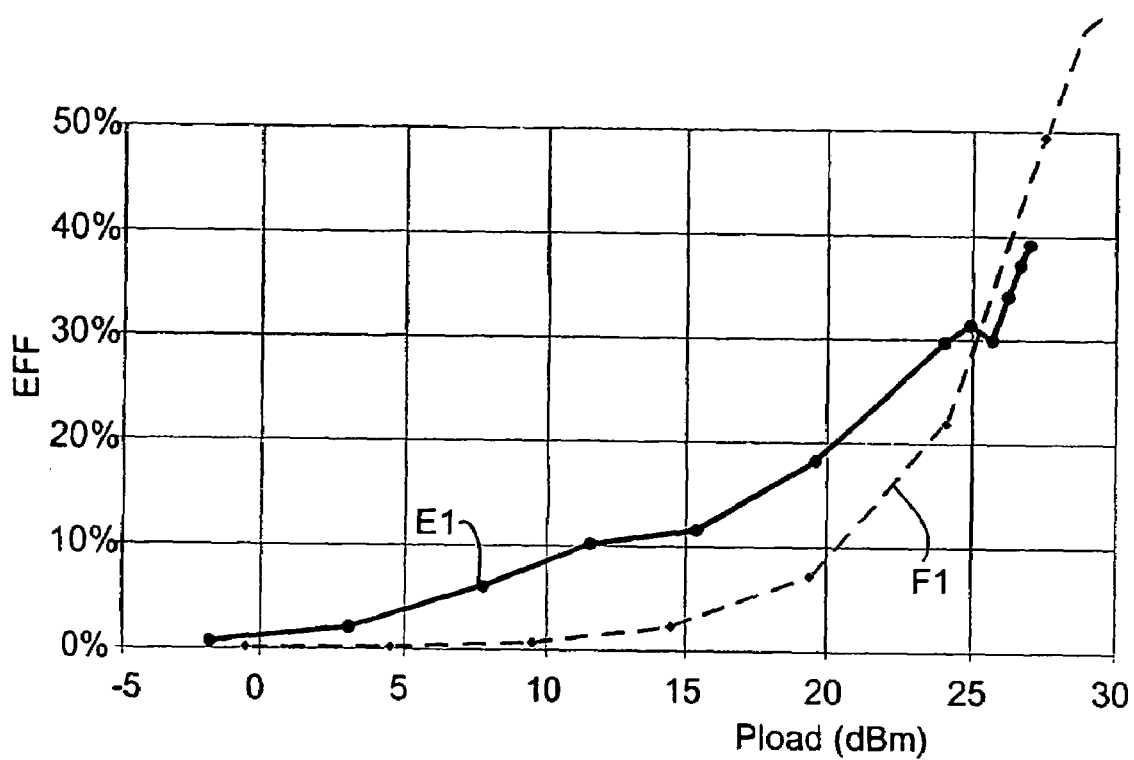
FIG. 5 shows a curve showing the effectiveness of measures recommended by the invention.

FIG. 5 shows the efficiency EFF of the amplifier produced according to the invention, curve E1. The curve F1 shows an amplifier to which none of said measures has been applied.

It is to be noted that such an amplifier 20 (FIG. 1) is particularly suitable for integration and can be presented in the form of an integrated circuit.

The invention claimed is:

1. An apparatus comprising a high-frequency signal amplifier formed by a main power stage which has an incoming signal input, an output for an amplified signal and a gain control, also comprising a first comparator for producing a signal having a distortion level between the incoming signal and the amplified signal and a differential element for removing the distortion signal from the amplified signal, characterized in that the differential element co-operates with an auxiliary amplifier stage which is inserted into a canceling loop for producing a constant-power distortion canceling signal.

2. An apparatus as claimed in claim 1, characterized in that the loop is formed by an output power measuring circuit of said auxiliary amplifier stage by a comparing circuit of this power to a set value and by a processing circuit for influencing said gain control.

3. An apparatus as claimed in claim 1, characterized in that the loop comprises means for producing an alarm signal when at least one of the output power values of said auxiliary stage and the amplitude of the control signal of the main stage are stopped.

4. An apparatus as claimed in claim 1, characterized in that the output power of said amplifier is solely produced by the auxiliary stage.

5. A method for amplifying a radio signal implemented in an apparatus as claimed in claim 1, characterized in that it comprises the following steps:

amplification of the signal to be amplified by a main power stage, comparison for determining the distortion of this main stage, of its input signal and of its output signal, amplification of this comparing signal by means of an auxiliary amplifier stage, subtraction of the output signal of the auxiliary amplifier stage from the output signal of the main power stage, use of a control loop to keep the output power of the auxiliary amplifier stage constant.

6. A method as claimed in claim 4, characterized in that it comprises an additional step:

amplification of the input signal of the amplifier executed in practice by the auxiliary amplifier stage.

7. A signal amplifier suitable for an apparatus as claimed in claim 1, comprising a main power stage which has an incoming signal input, an output for the amplified signal and a gain control, also comprising a first comparator for producing a signal that has a distortion level between the incoming signal and the amplified signal and a differential element for taking the distortion signal from the amplified signal, characterized in that the differential element co-operates with an auxiliary amplifier stage which is inserted in a canceling loop so as to produce a canceling signal for canceling the constant power distortion.

8. An amplifier as claimed in claim 7, characterized in that the loop is formed by a measuring circuit for measuring the output power of said auxiliary amplifier stage, by a comparing circuit for comparing this power to a set value and by a processing circuit for influencing said gain control.

9. An amplifier as claimed in claim 7, characterized in that the output power of said amplifier is solely produced by the auxiliary stage.

10. An amplifier as claimed in claim 7, characterized in that it is presented in the form of an integrated circuit.

* * * * *